United States Patent [19]

Strauss et al.

[11] Patent Number: 4,476,582
[45] Date of Patent: Oct. 9, 1984

[54] MOBILE BROADCAST RECEIVER WITH CHANNELS SELECTABLE ACCORDING TO RECEPTION LOCATION

[75] Inventors: Karl-Peter Strauss, Hildesheim; Jürgen Kässer, Diekholzen, both of Fed. Rep. of Germany

[73] Assignee: Blaupunkt-Werke GmbH, Hildesheim, Fed. Rep. of Germany

[21] Appl. No.: 484,569

[22] Filed: Apr. 13, 1983

[30] Foreign Application Priority Data

Apr. 17, 1982 [DE] Fed. Rep. of Germany ....... 3214155

[51] Int. Cl.³ ........................... H03J 7/20; H04B 1/16
[52] U.S. Cl. ................................... 455/166; 455/184; 455/186; 455/345
[58] Field of Search ................... 455/32, 62, 161, 166, 455/179, 184, 185, 186, 227, 345

[56] References Cited

U.S. PATENT DOCUMENTS 4,387,469 6/1983 Miyazaki et al. .................... 455/161
4,430,753 2/1984 Shiratani ............................. 455/166

FOREIGN PATENT DOCUMENTS 3034155 3/1982 Fed. Rep. of Germany ...... 455/161
52627 4/1980 Japan .................................. 455/185
26918 2/1982 Japan .................................. 455/161
95720 6/1982 Japan .................................. 455/161

Primary Examiner—Jin F. Ng
Attorney, Agent, or Firm—Frishauf, Holtz, Goodman & Woodward

[57] ABSTRACT

The location coordinates, as well as the transmitting station frequencies, of stations that broadcast the same programs by network arrangements or otherwise, are stored so that when a particular program (network) is selected, all these stations broadcasting the same program as a station being listened to which are not more than a prescribed maximum distance from the station being listened to, may be listed in a table in a working store. While a particular station is being listened to, therefore, continuous checking of the station being listened to with other stations broadcasting the same program for relative reception quality can be carried out automatically while a station is being listened to in a moving vehicle, without taking into account the signals broadcast by stations that are too far away. As soon as some other station broadcasting the same program is found to provide better reception, it is automatically tuned in, and from then on the distance criterion is referred to the location of the new station, a new set of stations for signal comparison is selected and the comparative signal checking process is continued automatically.

10 Claims, 1 Drawing Figure

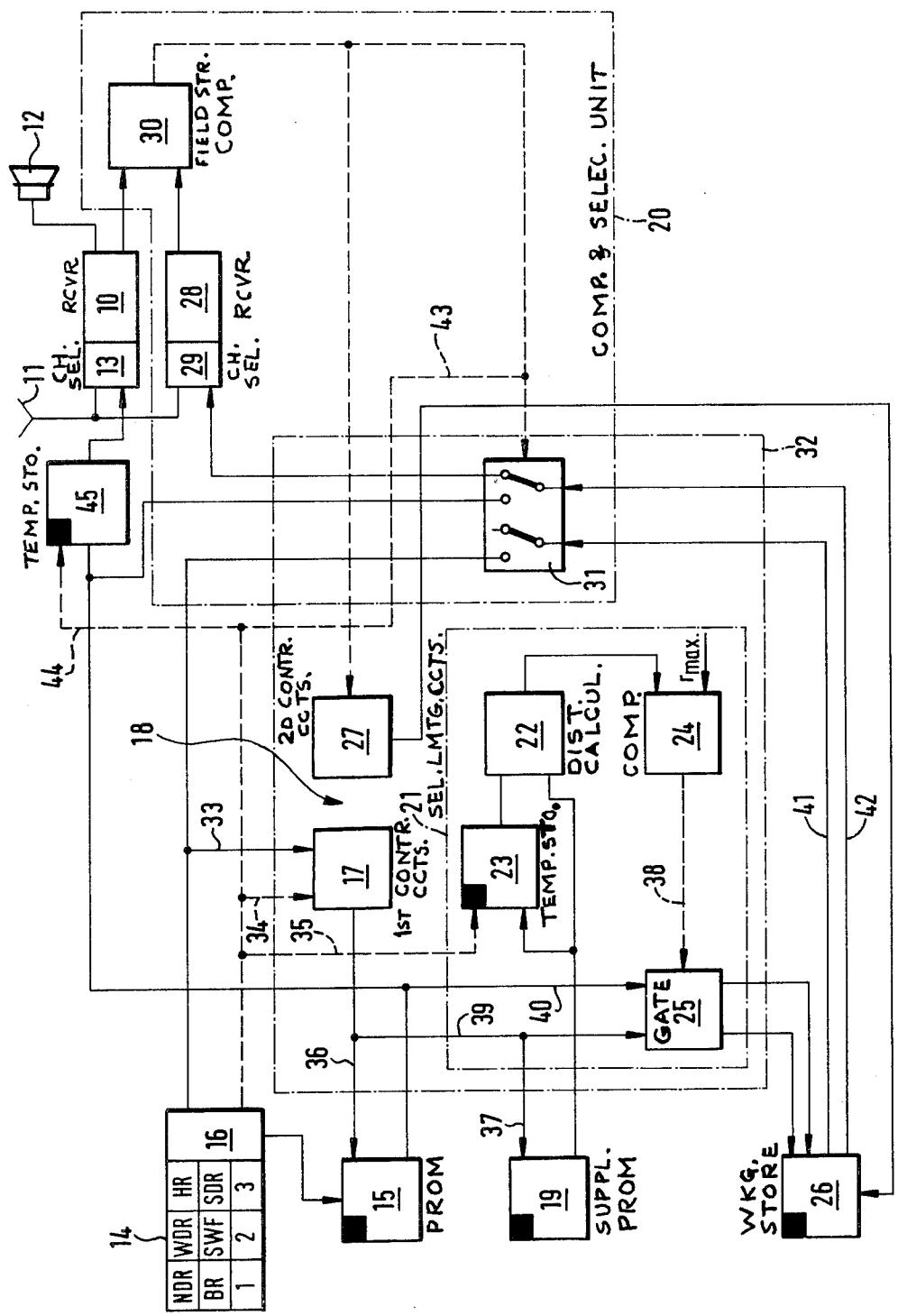

MOBILE BROADCAST RECEIVER WITH CHANNELS SELECTABLE ACCORDING TO RECEPTION LOCATION

This invention concerns a radio broadcast receiver of the kind serving a traveler, particularly for vehicular use, having automatic tuning for reception from a transmitter broadcasting a selected network program and utilizing a fixed information store (ROM) in which network and transmitter data are stored and means for tuning the receiver, by consultation of the store, to a transmitter that is broadcasting with the same program network and for determining whether the reception quality of the selected program from a particular transmitting station is better or worse than that of another station transmitting the same program.

In automobile broadcast receivers the problem arises that the received signal coming from a particular VHF or UHF broadcast station becomes weaker and ultimately drops out completely when the distance from the receiver to the transmitter becomes greater and greater. If the listener desires to continue hearing the same program, the receiver must be tuned anew to another transmitting station on a different frequency which is broadcasting the same network program and is substantially closer to the momentary location of the receiver. Since the range at which a VHF or UHF transmitter can provide an acceptably receivable signal is limited by the curvature of the earth, the driver of a vehicle desiring to follow a broadcast program during a relatively long trip is required to tune the receiver several times.

There is accordingly a need to relieve the driver from this necessity and to provide that once he has preselected a program for reception, the transmitter broadcasting that program with the best reception quality at the momentary location of the vehicle should be automatically tuned in without any further action of the driver.

In a known automobile radio receiver, a fixed information store is constituted as an electrically alterable read-only memory (EAROM) which can be programmed to store the necessary information regarding six network programs and each of ten transmitter frequencies of the respective stations that broadcast the aforesaid six network programs. In such a memory, the store preserves the information programmed into it, even without the presence of a supply voltage, and the information can be called out at any time. If a desired transmitting station selected by manual selection or by automatic search is tuned in, a read-out device which is part of a microcomputer reads out the transmitter frequencies continuously which are stored under the address of the broadcast program actually being received. The transmitter frequencies thus read out are then checked by a comparison and selection unit that is likewise integrated into the microcomputer, as to whether they provide better reception quality than the transmitter actually being received. If that should be the case, the transmitter frequency of the station with the better reception quality is provided to the tuning system, and the receiver is tuned accordingly.

In the known mobile radio above described, the fixed information store must be programmed by the user himself or herself, in which case he must take into account not only his or her own preferences regarding network programs, but also the geographic location and principal travel region of the vehicle. A total of six different programs can be put into memory, and the transmitters broadcasting these programs according to a broadcasting schedule that the user of the vehicle may procure for himself. The vehicle user must in such case take account of the distance to the individual transmitters and to exclude those transmitters of the programming of the EAROM for which the distance from the transmitter to the place the vehicle is kept and the principal travel region of the vehicle is too great in order to make possible any reception at all of usable quality.

The known mobile broadcast receiver has troublefree operation if the vehicle moves only within a radius of about 30 miles of the place where it is kept. For greater travel pass, on the one hand, the distance to the transmitters programmed into the EAROM becomes steadily greater with the passage of travel time, so that these can be received only poorly or not at all and, on the other hand, transmitters located in the region in which the vehicle is actually located are no longer programmed into the system.

In addition, there is the problem that transmitter frequencies are in multiple use by transmitters of various stations that are relatively far apart, so that their service areas to not intersect. If the vehicle penetrates into the service area of a transmitter operating on a frequency subject to multiple assignments, then another program network which has not been selected and is presumbaly undesired, will be automtically tuned in and received.

The above-described known mobile broadcast receiver is accordingly suitable, in the form described, only for short distance travel in a prescribed limited region. As soon as that region is left behind, the user is compelled, as before, to tune the broadcast receiver by hand.

THE INVENTION

It is an object of the present invention to make possible the automatic tuning change from one to another of stations both broadcasting a selected program as the vehicle moves from the vicinity of one station to the vicinity of the other without requiring the listener to retune or reprogram the receiver.

Briefly, between the EAROM and the comparison and selection circuits, a transmitter selection limiting device is interposed which permits comparison of the actually received signal only with those of the transmitters read out from the EAROM which are at a distance not exceeding a prescribed maximum value from the transmitter being received at the moment.

With the broadcast receiver of the invention, the user is relieved from the necessity of selection and programming of the stations and networks. In the fixed information store, all of the stations in a large region, for example Eastern, Central, Rocky Mountain or Western U.S., or a northerly portion of the U.S. with an adjoining part of Canada, or a southerly portion of the U.S. with an adjoining part of Mexico can be covered in the storing of VHF stations or UHF stations, and the corresponding program networks in accordance with station network data. Programs that are distributed by network so as to appear simultaneously in the transmissions of stations located at considerable distances from each other can thus be stored. The selection of those of the stations in which stations can be received at all on the basis of the vehicle location is automatically carried out by the station selection limiting unit.

On the other hand, there is provided for the vehicle driver in each partial region a much larger reception region (e.g., that of the regions listed for example above) in which all the receiveable stations are made available for selection which can be automatically tuned according to the criteria of optimum reception on the basis of the selection of the desired program. If the broadcast receiver also has a so-called identification circuit by which the station tuned by search is identified and the identification displayed to the user, even those programs can be selected that are not listed in a key selection field for manual selection, but can simply be received at the momentary location and travel region of the vehicle. A knowledge of the momentary location of the vehicle is not necessary, a matter which is a significant feature of the invention. On the basis of the distance criterion the possibility is excluded that an undesired program should be tuned in as the result of the multiple assignment of a transmitting frequency.

It is particularly advantageous to provide a supplementary store in which the location coordinates of the transmitters are correlated to the transmitting frequencies in such a way that for every transmission program address, the transmitter frequencies and the corresponding location coordinates of the transmitter can be called out. The location coordinates may be the geographic longitude and latitude values or the x and y coordinates of an arbitrarily determined coordinate grid which covers the reception region in question.

It is further advantageous for a distance calculator to provide, from the coordinates of the transmitter locations of the transmitters read out of memory, their distance from the transmitter location of the station that is at the moment tuned in, so that by a simple comparison with the prescribed distance maximum, transmitters can be selected according to the distance criterion and all those transmitters that are too far away may be excluded from the checking of their signal reception in comparison with the signal being used at the time. This avoids checking in vain a number of signals that are unlikely to be received well.

It is also advantageous to put into a working store a table of so-called neighboring stations which are radiating the same program that is being received at the moment and which are not farther from the station being received at the moment than the prescribed maximum distance. From this table obtained by means of the transmitter selection circuits of the receiver, the stations there listed may then be read out successively for checking the reception quality. This has the advantage that not all transmitters broadcasting a desired program need to be checked continuously and thereby a rapid latching onto a transmission worthy of being received is made possible. The neighboring transmitter table can be kept up to date continuously, which is to say it will be changed every time that on the basis of checking the reception quality another station operating on a different transmission frequency, but sending out the same program, is tuned in.

In order to call out the different coordinates of a newly tuned in transmitter and supply them to the distance calculator, in order to constitute the new neighboring station table relating to the newly tuned in station, by renewed distance calculations, it is particularly useful to store in the working store, along with the station frequencies, also the addresses under which the particular frequencies are stored in the fixed store, and to store these addresses in the working store in correlation with the transmission frequencies stored there. In this manner, it is possible by transferring the address relating to the newly tuned in station out of the working store, to call out from the supplementary store into the read-out device, the coordinates of the newly tuned in station and to supply these to the distance calculator.

THE DRAWING

The invention is further described by way of illustrative example with reference to the annexed drawing, in the single FIGURE of which a circuit block diagram of a VHF or UHF receiver suitable for automobile radio reception embodying the invention is shown.

DESCRIPTION OF THE ILLUSTRATED EMBODIMENT

The receiver has a receiving portion 10 which in the known way contains an intermediate frequency portion, an oscillator circuit, a demodulator and a low-frequency portion. An antenna 11 provides the signal input and a loudspeaker 12 provides an output connected to the low-frequency portion.

The receiver further has a channel selection device 13 which is constituted as a scanning automatic tuner and causes the receiver portion 10 to tune through the reception band until it sets itself on the prescribed transmitter frequency. The transmission frequency can be either manually prescribed by means of a selection field 14 or it can be chosen by operating a known scanning search automatic tuner from a start signal so as to stop on the first received signal of sufficient strength for good quality reception. In the latter case, in order that the user may know the identity of the transmitter thus tuned in, a so-called transmitter identifying device is provided that visually indicates the program network of the station being received, for example.

The receiver also has a fixed store 15 in the form of a PROM, in which for every broadcast program a table of station frequencies fqr all of the stations broadcasting that program is stored. All of the receivable transmitter programs with the related station frequencies for a relatively large region, such as, for example, northeastern U.S. and the adjoining part of Canada, are stored in the PROM. It may be useful to store still other information regarding the station or program identification according to what information may be encoded on the broadcast signal.

Each broadcast program is freely accessible and selectable over an addressing unit 16 controlled by the manual switch field 14 or the station identifying unit 21. The stations which broadcast a particular program are addressable successively through a first control unit 17 of a read-out device 18. The control circuit 17 can be a simple pre-settable up/down counter. The count content of the counter provides the addresses of the individual stations of the group. In the case of pre-selection of the station by means of the switch field 14, the counter, at the time of addressing the desired broadcast program, is set by the addressing unit 16, for example, to the highest count content and thereby addresses the first station in the station table of the addressed broadcast program. In the case of the presence of a station identifying unit, the count contents are preset on the particular content value which corresponds to the address of the station to which the set has been tuned. After reading out of the station frequency, the counter counts up to the highest count content, and then addresses by downwards counting the successive stations broadcasting the same program, beginning from the first one in the table.

A supplementary store 19, likewise constituted as a PROM, is associated with the fixed information store 15. In the store 19, the location coordinates of the station transmitter locations are stored under the same address as the corresponding station frequencies in the fixed information store 15. The supplementary store 19 can be constituted as a separate memory or it can be integrated into the fixed information store 15, so that an address (count content) provided by the control circuits 17 can produce both the station frequency and also the location coordinates of the transmitter. The read-out unit 18 addresses successively all the stations broadcasting a selected program until the entire station table for the program has been gone through.

The receiver also has a comparison and selection unit 20 which compares the reception quality of the signals from the stations identified by successive read-outs from the table just mentioned, with the station being received at the moment in accordance with the tuning of the reception portion 10 of the receiver. The output of the comparison and selection unit 20 causes the tuning unit 13 to be set on the station which has the better reception quality of the two that were just compared. For shortening this checking procedure and for eliminating false tuning resulting from multiple frequency assignments, there is interposed between the fixed store 5 and the comparison and selection unit 20 a station selection limiting circuit 21 that permits only those stations designated in the fixed store 15 to have their signals checked for reception quality which are located at a distance not greater than a prescribed maximum than the transmitter of the station being received at the moment. Such a maximum distance value can be derived from the usual maximum range from the transmitter at which a UHF or VHF receiver can provide adequate reception. Thus it is practical, as a practical matter, to admit signals to the comparison and selection circuit only when they come from transmitters that are not beyond the usual reception distance from the vehicle without the necessity of keeping track of the actual geographical location of the vehicle.

The station selection limiting circuit 21 has a distance calculator 22 which calculates, from the coordinates of the station being received in the reception portion 10 of the receiver at the moment, and the coordinates of the transmitters of the stations successively read out of the fixed store 15, the distance of the latter from the station being received at the moment. The location coordinates of the transmitter of the station to which the reception portion 10 is tuned at the moment are stored for the duration of reception from that station in a temporary storage unit 23 provided at the input of the distance calculator 22. A comparator 24 is provided at the output of the distance calculator 22 which compares the result produced by the distance calculator 22 with a fixed maximum distance value $r_{max}$ permanently set into the comparator, which maximum value can be arbitrarily chosen and preferably based on the usual maximum service range of a VHF or UHF broadcast transmitter.

The output of the comparator 24 is connected to the control input of a gate circuit 25 that has two inputs and two outputs. One input of the gate 25 is connected to the data output of the fixed store 15 at which the station frequencies are furnished. The related output is connected to the data input of a working store 26 which is constituted as a read/write store, preferably a random access store (RAM). The other input of the gate circuit 25 is connected to the addressing output of the control circuit 17. The output of the gate 25 related to the last-mentioned input is likewise connected with a data input of the working store 26. If the comparator 24 recognizes that the computed distance is the same or smaller than the prescribed maximum distance $r_{max}$, the aforesaid input/output paths of the gate 25 are completed (conducting) and in other cases they are blocked. In order that the drawing may be more readily understood, all connections that transmit data are shown in solid lines, and control connections for transmitting control commands are shown in broken lines.

The working store 26 is addressed by a second control circuit 27 of the read-out unit 18. The second control circuit 27 can again be a simple up/down counter, the count content of which provides the address for the working store 26. The control circuit 27 on its part is controlled by the comparison and selection circuit 20.

The comparison and selection circuit 20 comprises a further reception portion 28, the constitution of which is identical with that of the receiving portion 10 and that is likewise connected to the antenna 11. The reception portion 28 is tuned either by a separate station tuning unit 29 identical with the station tuning unit 13, or else the station tuning unit 13 is used for the purpose. In the latter case, a holding circuit must be provided in the reception portion 10 that keeps the reception portion 10 receiving the already selected station, while the station tuning unit 13 tunes the second reception portion 28 to the station frequency read out from the working store 26.

The respective field strengths of the stations, to which the reception portions 10 and 28 are respectively tuned, are supplied to a field strength comparator 30. If the field strength of the station set in the reception portion 28 is the same as or smaller than the field strength of the station tuned in the reception portion 10, the field strength comparator provides a control signal to the second control circuit 27 of the read-out unit 18 that calls out the next address and provides it to the working store 26. In the other case, thus when the field strength of the station tuned in the reception portion 28 is greater than that tuned in and received by the reception portion 10, the field strength comparator 30 provides a signal to a switch 31 that changes its switching condition and then maintains the new condition as long as this control signal is present at its control input. The switch 31 has two inputs that each can be selectively connected to two outputs. One input is connected to the data output of the working store 26 at which the station frequencies are read out appear. This input can be selectively connected to the station tuning unit 29 or to the station tuning unit 13. The other input of the switch 31 is connected to the data output of the working store 26 at which the addresses corresponding to the station frequencies can be taken from the working store 26. In the basic position of the switch 31 shown in the drawing, the input just mentioned is connected with an open output and can selectively be switched over to another output which is connected to the read-out unit 18 and supplied to the latter the addresses read out from the working store 26. In the basic position of the switch 31 shown in the drawing, a basic position which this switch always assumes when no control signal appears at the control input of the switch 31, thus when the field strength comparator 30 detects no field strength in the reception portion 28 which is greater than the field strength of the station set in the reception portion 10 and received, the data output of the working store 26 is connected over the switch 31 to the station tuning unit 29, so that the station frequencies that are read out and are to be set in the reception portion 28 are always supplied to the station tuning unit 29. The station tuning unit 13 has another temporary store 45 provided at its input that has its data output connected on the one hand with the siezed output of the switch 31 and on the other hand with the data output of the fixed value store 15 at which the station frequencies that are read out appear.

The read-out unit 18, the station selection limiting circuit 21 and at least part of the oomparison and selection unit 20, except the additional reception portion 20 and the additional station tuning unit 29, are integrated into a microcomputer 32 which is emphasized in the drawing by heavy broken-line framing.

The manner of operation of the above-described VHF or UHF receiver, is illustrated, with reference to a receiver equipped for selecting European VHF stations, as follows.

By means of a switch field 14, a desired station program, for example NDR 2, is selected (press the buttons "NDR" and the button "2"). In European practice, different programs will be radiated from the same location on corresponding frequencies by the same station using different transmitters operating on respectively different frequencies, whereas the same program designated 1, 2 or 3, is radiated by one of the transmitters of each of a number of different stations. The addressing unit 16 calls the transmission program address into the fixed store 15 and sets the control circuit 17 constituted as a counter at a count content which corresponds to the address of the first station which is recorded in the fixed store 15 under the program address. The presetting of the counter 17 takes place over the connection 33, which is activated by means of a load command supplied by the addressing unit over the control line 34. The fixed store 15 is addressed over the address line 36, while the supplementary store 19 is addressed over the address line 37. The station frequency of the first station in the fixed store 15 is read out and likewise the coordinates of the corresponding transmitter location are read out of the supplementary store 19. The station frequency is supplied to the temporary store 45, and the coordinates likewise to the temporary store 23. The load command for the counter 17 is applied at the same time over the control lines 44 and 35 as write commands to the control command inputs of the temporary stores 45 and 23, so that the information then presented is written into the respective stores. The station frequency written into the store 45 is supplied to the station tuning unit 13 which tunes the receiving portion 10 of the receiver through its tuning range until the station frequency is tuned in and the station can be listened to with the selected program transmission at the loudspeaker 12.

The counter 17 now reduces its count content in the next count period, as the result of which the fixed store 15 and the supplementary store 19 are addressed anew and now the station frequency and location coordinates of the next station having the same program address are read out. The coordinates of the station next read out are supplied to the distance calculator 20, to which at the same time there are supplied the contents of the temporary store 23, thus the coordinates of the station being received at the moment in the reception portion 10. The distance calculator 22 calculates the distance of the transmitters from each other out of the respective sets of coordinates of the two transmitters, on the basis of simple geometric relations, and supplies the result to the comparator 24. The comparator 24 compares the calculated distance with the prescribed maximum distance $r_{max}$ and provides a blocking signal over the control line 38 to the gate 25 if the calculated distance is greater than $r_{max}$ and a connection enabling signal to the gate 25 if the distance is the same or smaller than $r_{max}$. The station address called out at the stores 15 and 19 is supplied over the line 39 and the station frequency read out at this address from the store 15 over the line 40 to the gate 25. If the gate 25 receives a conduction enabling signal, the address and the station frequency are written into the working store 26. Addressing of the working store 26 is thus not absolutely necessary and the storage places can be successively occupied instead. The counter 17 now reduced its count content by a further downcount step and addresses thereby a new station out of the stores 15 and 19. The above-described steps are continuously repeated until the counter 17 has reached its zero count condition. All stations are thereby provided to the working store 26 which are broadcasting the same program and are recorded with reference to their respective station frequencies and their addresses under which they can be found in the stores 15 and 19, to the extent that they satisfy the criterion of distance from the station being received in the reception portion 10 and, therefore, are not distant therefrom by more than the prescribed maximum distance. The control circuit 27 that is likewise constituted as a simple counter, now addresses, one after the other, all the stations stored in the working store 26. For each station, there are supplied over the line 41 the read-out address of the station and over the line 42 the read-out frequency, these being supplied to the switch 31. The switch 31 is set in such a way that the read-out station frequency will be supplied to the station tuning device 29 for tuning the latter to that station frequency.

The field strength of the station tuned in and being received in the receiving portion 10 and the field strength of the station tuned in the receiving portion 28 are now supplied to the field strength comparator 30. If the field strength of the station tuned in the receiving portion 28 is the same or smaller than the field strength of the station tuned in the receiving portion 10 and being listened to over the loudspeaker 12, the field strength comparator 30 provides a signal to the control circuit 27 that then reads out the next station designation stored in the working store 26. This procedure is continuously repeated until the field strength comparator 30 finds a field strength in the receiving portion 28 which is greater than the field strength of the station tuned in the receiving portion 10 and being listened to through the loudspeaker 12. In this case a control pulse reaches the switch 31 that on the one hand separates the line 42 from the station tuning unit 29 and connects it with the write input of the temporary store 25 and, on the other hand, connects the line 41 over the line 33 with the preset or load input of the first control circuit 17. The station frequency most recently read out at the working store 26 is thereby written into the temporary store 45 and supplied from there to the station tuning unit 33 which now tunes the reception portion 10 to the new station frequency. A new station with the same program but better reception quality is then to be heard at the loudspeaker 12. The writing in of the new station frequency into the temporary store 45 is made possible by the control pulse of the field strength comparator 30 for the switch 31, which pulse is supplied over the control lines 43 and 44 as a write command to the control command input of the temporary store 45. At the same time, the address corresponding to this station frequency, which address was last read out of the working store 26, is supplied over the lines 41 and 33 to the first control circuit 17 and the counter which constitutes the control circuit 17 is thereby preset anew. The counter is enabled for thus being preset by the control pulse provided from the field strength comparator to the switch 31 which proceeds over the control lines 43 and 34 also to the counter. The control circuit 17, using the new address, calls out the coordinates of the newly tuned in station out of the supplementary store 19 which are written into the temporary store 23. For writing these coordinates in, the just mentioned control pulse proceeds over the control lines 43 and 35 also to the control input of the temporary store 23. As described above, the counter 17 counts its preset count content stepwise down, in the course of which a new table of stations eligible for reception are written anew in the working store 26 in the above-described manner. This new station table accordingly satisfies the distance criterion with respect to the newly tuned in station which is now being received. The new station table of the working store 26 is then checked through in the same way as above described for reception quality.

In American practice, identity of programs among UHF or VHF broadcast stations, to the extent that it exists, has up to now normally been established by network arrangements, as for example the "Yankee Network" in New England, which was one of the first established in VHF broadcasting. Such arrangements provide a possibility of program selection similar to what is readily obtainable in Europe.

The fixed store 15 would then store the station frequency and locations of all stations operating in each of the several networks, and when a particular station is tuned in, it would accordingly be possible by reference to the fixed store 15 to obtain an identification of the network in which the station operates if it operates as a member of a network.

The invention is not limited to the system illustrated in the drawing and described above. For example, the second reception portion 28 is not absolutely necessary. The function of the reception portion 28 can also be taken over by the reception portion 10 if the reception quality checking is carried out by a suitable recognition of a pause in the program transmission during which only the carrier of the received station is being received and the comparison is made during such program pauses. The direct connection of the temporary store 45 with the switch 31 is also not necessary. The temporary store 45 can also be loaded from the fixed store 15 after the determination that another station can be received with better reception quality, the loading of the designation and coordinates of the new station then taking place in the same way as in the case of a manual selection of a newtork or program.

Thus it will be seen that modificatons and variations are possible within the inventive concept. For the electronic computation of the distance between points the coordinates of which are given, reference is made to the well-known art of navigational computers for the case where the coordinates are latitude and longitude and to the Pythagorean algorithm $$r = (x_1 - x_2)^2 + (y_1 - y_2)$$

where the coordinates r, $x_1, y_1$ and $x_2, y_2$ in a Cartesian grid. Subtraction circuits, squaring circuits, addition circuits and square-root-extracting circuits are well-known.

We claim:

1. Mobile radio broadcast receiver for automatically tuning from one to another of VHF or UHF stations broadcasting a network program as the receiver is carried, in a vehicle, away from the service area of the station to which it was most recently tuned, comprising:

tuning means for initially tuning the receiver to a station that broadcasts a network program, for maintaining reception of said station until said means are controllably switched over to tuning another station and thereafter for maintaining said receiver tuned to said other station;

fixed information storage means for storing frequency assignments and transmitter location coordinates of stations receivable by the receiver in their respective service areas along with identification of networks of which the programs are broadcast by the stations of which the frequencies and coordinates are stored;

means for reading out of said fixed information storage means the frequency assignments and location coordinates stored therein for the stations that broadcast the same network program as the station in which the receiver is contemporaneously tuned to receive;

distance discriminating means including distance calculating and distance comparing means for selecting from the output of said reading out means the read-out frequency assignments of only those stations of which the transmitter locations are at a distance from the transmitter location of said station which the receiver is contemporaneously tuned to receive, which distance does not exceed a predetermined maximum distance, and for storing said selected frequency assignments in a working temporary store;

means for comparing the quality of reception of said station which the receiver is contemporaneously tuned to receive, successively, with the available reception quality of the stations of which the frequency assignments are stored in said working store, and means, responsive to determination by said comparing means that reception of a station of which the frequency assignment is stored in said working store is available with better quality than reception of said station in which the receiver is contemporaneously tuned to receive, for switching over said tuning means so as to tune the receiver for reception of said station, the reception of which has been found to be available with better quality.

2. Mobile radio broadcast receiver according to claim 1 in which said fixed information storage means comprises a first fixed information store for storing said frequency assignments and a second fixed information store for storing said transmitter location coordinates, said storage means further including means for access, by means of a storage address identifying a selected network program, both to said frequency assignments stored in said first fixed information store and said location coordinates stored in said second fixed information store which relate to stations receivable by the reciever in their respective service areas which broadcast said selected network program.

3. Mobile radio broadcast receiver according to claim 2 in which said distance discriminating means include a gate (25) interposed between a data output of said fixed information storage means and said means for successively comparing station reception quality (20), said gate being controlled by said distance comparing means of said distance discriminating means.

4. Mobile broadcast receiver according to claim 3 in which said distance calculating means are provided at the input thereof with a second temporary store (23) for storing the location coordinates of the transmitter of the station which the receiver is contemporaneously tuned to receive.

5. Mobile radio broadcast receiver according to claim 3 in which said gate circuit (25) is interposed between the data input of said working temporary store (26) and a data output of said first fixed information store (15).

6. Mobile radio broadcast receiver according to claim 3 in which said reading out means, said distance discriminating means and said gate circuit and at least part of said means for successively comparing reception quality are incorporated into a microcomputer (32).

7. Mobile radio broadcast receiver according to claim 2 in which said reading out means includes a first control circuit (17) for addressing said first fixed information store (15) and a second control circuit (27) for addressing said working temporary store (26).

8. Mobile radio broadcast receiver according to claim 7 in which said means for successively comparing the quality of reception comprises second reception means (28) associated with second tuning means (29) therefor for independently receiving a station other than the one which the broadcast receiver is tuned to receive and a field strength comparator (30) for comparing the output of said second receiving means to a signal received from the station which the radio broadcast receiver is contemporaneously tuned to receive, said field strength comparator having its output connected with said second control circuit (27) of said reading out means, and in which there is also provided a transfer switch (31) connected to the output of said field strength comparator for selectively connecting the output of said working temporary store (26) either with said tuning means by which reception of a station is maintained or with said second tuning means.

9. Mobile radio broadcast receiver according to claim 1 in which said working temporary store is constituted as a read-write store.

10. Mobile radio broadcast receiver according to claim 9 in which said working temporary store (26) is constituted to store, in addition to the frequency assignments of stations, the addresses at which said station frequency assignments are stored in said storage means.

* * * * *